(12) United States Patent
Mori et al.

(10) Patent No.: US 7,652,941 B2
(45) Date of Patent: Jan. 26, 2010

(54) MEMORY DEVICE

(75) Inventors: Kaoru Mori, Kawasaki (JP); Shinya Fujioka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/133,890

(22) Filed: Jun. 5, 2008

(65) Prior Publication Data

US 2008/0291763 A1    Nov. 27, 2008

Related U.S. Application Data

(63) Continuation of application No. 11/024,734, filed on Dec. 30, 2004, now Pat. No. 7,394,709.

(30) Foreign Application Priority Data

Jun. 10, 2004    (JP)    .............................. 2004-172967

(51) Int. Cl.
*G11C 7/00*    (2006.01)
(52) U.S. Cl. ............. 365/203; 365/189.04; 365/189.09; 365/196; 365/207

(58) Field of Classification Search ................ 365/203, 365/189.04, 189.09, 196, 207
See application file for complete search history.

(56) References Cited

U.S. PATENT DOCUMENTS

| 5,748,520 | A  | * | 5/1998  | Asaka et al. ................. 365/149 |
| 6,018,481 | A  | * | 1/2000  | Shiratake ..................... 365/190 |
| 6,144,599 | A  | * | 11/2000 | Akita et al. .................. 365/203 |
| 6,181,618 | B1 | * | 1/2001  | Inaba et al. .................. 365/203 |
| 6,343,038 | B1 |   | 1/2002  | Makino et al.                           |

FOREIGN PATENT DOCUMENTS

JP    2001-76498 A    3/2001

* cited by examiner

*Primary Examiner*—Thong Q Le
(74) *Attorney, Agent, or Firm*—Arent Fox LLP.

(57) ABSTRACT

A memory device is provided which has: a memory cell to store data; a word line to select the memory cell; a bit line connectable to the selected memory cell; a precharge power supply to supply a precharge voltage to the bit line; a precharge circuit to connect or disconnect the precharge power supply to or from the bit line; and a current limiting element to control the magnitude of a current flowing between the precharge power supply and the bit line at least by two steps according to an operation status.

18 Claims, 16 Drawing Sheets

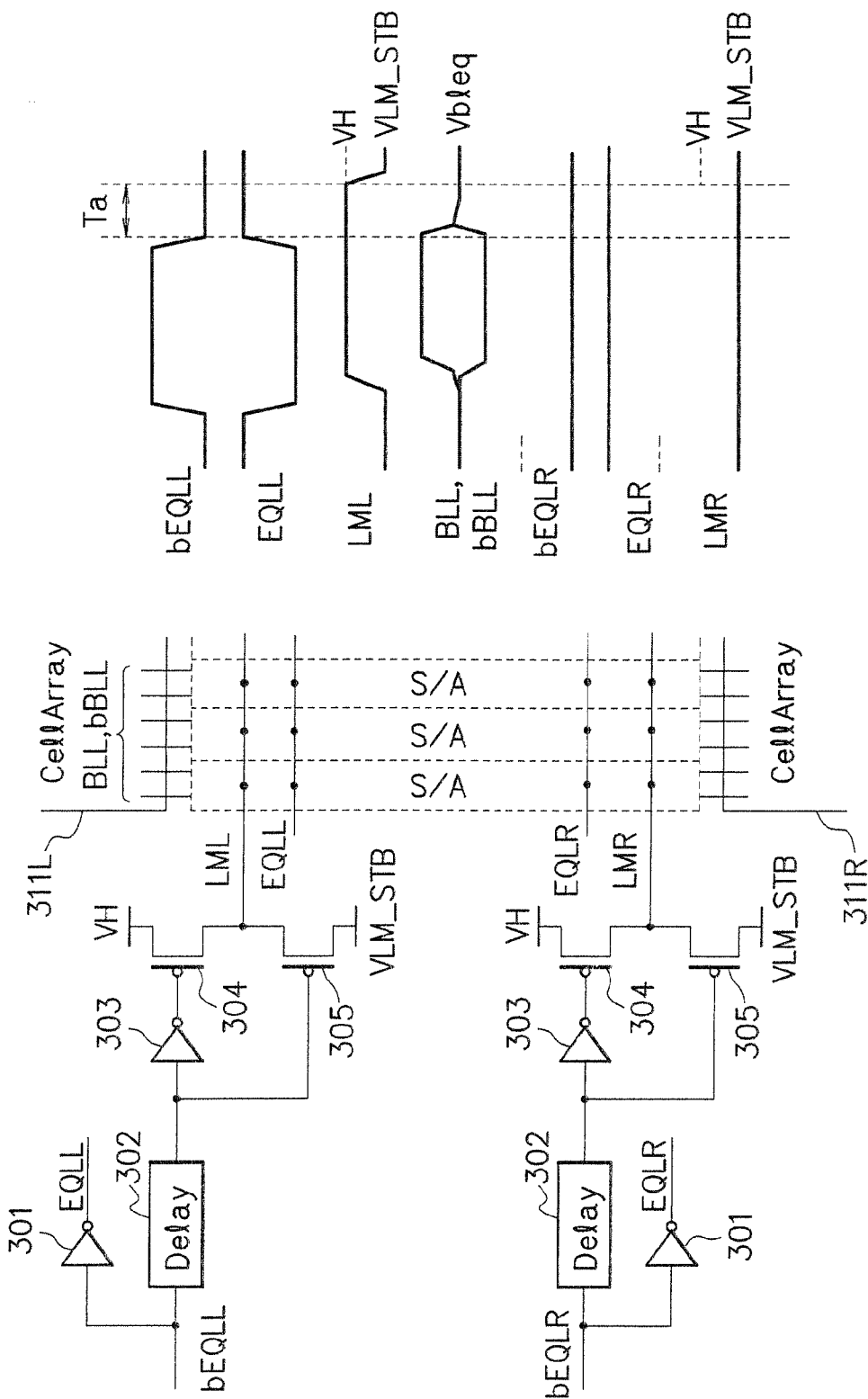

F I G. 13
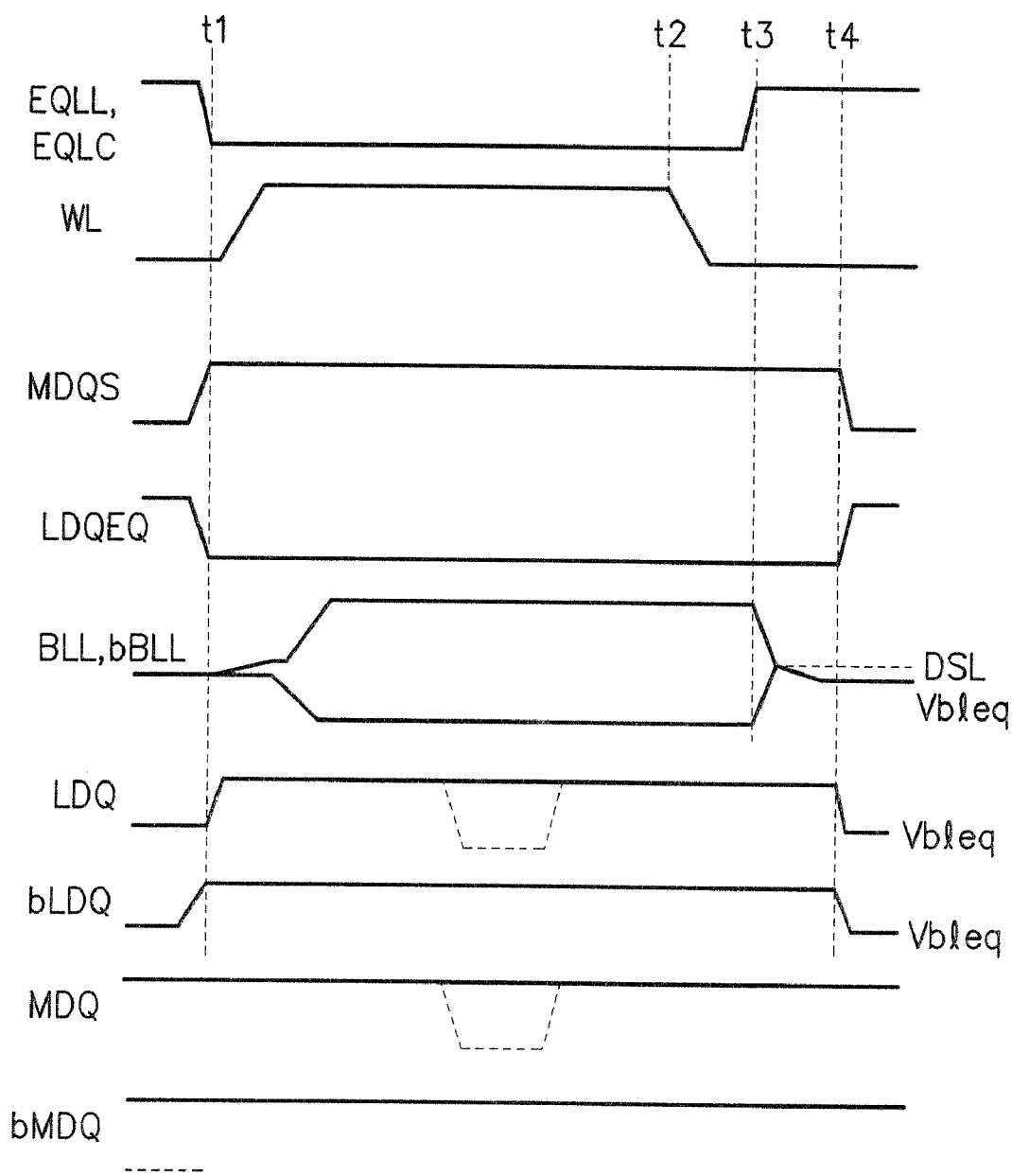

MEMORY DEVICE

CROSS-REFERENCE TO RELATED APPLICATIONS

This application is a continuation of U.S. patent application Ser. No. 11/024,734, filed Dec. 30, 2004 now U.S. Pat. No. 7,394,709 and is based upon and claims the benefit of priority from the prior Japanese Patent Application No. 2004-172967, filed on Jun. 10, 2004, the entire contents of which are incorporated herein by reference.

BACKGROUND OF THE INVENTION

1. Field of the Invention

The present invention relates to a memory device, and particularly relates to a memory device which needs precharging of a bit line.

2. Description of the Related Art

FIG. 14 is a circuit diagram of DRAM (dynamic random access memory) according to Japanese Patent Application Laid-open No. Hei 8-263983. As a cause of occurrence of a standby current in DRAM, there is a DC (direct current) due to cross failure between a word line WL and a bit line BL. Specifically, when there is an insulation failure between the word line WL and the bit line BL, the voltage of the bit line BL decreases, so that a standby current increases. In order to reduce this, a current limiting element Q20 is arranged between precharge circuits Q13, Q14, Q15 on the bit line BL and a precharge power supply 1401 so as to limit a precharge power supply current supplied to the location where the cross failure occurs.

The arrangement of the current limiting element Q20 between the precharge circuits Q13, Q14, Q15 on the bit line BL and the precharge power supply 1401 enables to limit a direct current originated in the cross failure in a standby state. On the other hand, at the time of precharging bit lines BL, bBL, a precharge current which can be supplied to the bit lines BL, bBL is similarly limited, so that an operation of equalizing the voltage of the bit lines BL, bBL with a desired bit line precharge voltage becomes slow. Particularly, in the case where a bit line precharge voltage which becomes a reference voltage when reading data is set lower than the intermediate potential between a logical value 1 and a logical value 0 of a memory cell so as to improve an overall data holding characteristic, a direct short level between the complementary bit lines BL and bBL and a bit line precharge voltage becomes different, and if the operation of equalizing the bit line voltage with the precharge voltage is slow, the reference voltage does not return to desired level until the next reading. Consequently, the effect of improving the data holding characteristic becomes small, and an AC (alternating current) in a standby state increases.

As described above, the current value of the current limiting element Q20 cannot be set equal to or smaller than a current value which cannot satisfy precharging characteristics of the bit lines BL, bBL. Accordingly, the increase in standby current is large when the number of cross failures increases, so that a yield of the standby current with respect to the standard deteriorates.

FIG. 15A and FIG. 15B are a circuit diagram and a signal waveform diagram of DRAM according to Japanese Patent Application Laid-open No. 2000-182374. Regarding the above-described problem, this patent application discloses an elemental technology for improving a precharge characteristic.

A bit line precharge/equalize circuit 15 is shared by memory cell arrays on both sides respectively of a shared sense amplifier, a current limiting element Q20 and a switching transistor Q30 are arranged in parallel between the precharge/equalize circuit 15 and a line 40 of precharge voltage Vbleq, and further a control circuit 30 is included which turns on the switching transistor Q30 for a predetermined period by receiving a control signal from a precharge/equalize circuit 15. In the case that bit lines BLR, bBLR of the memory cell array on the other side of the shared sense amplifier become floating and the level thereof decreases while the memory cell array on one side of the shared sense amplifier is being accessed, the switching transistor Q30 is turned on for a predetermined period at the time of precharging to thereby raise the bit line level to the precharge voltage level.

In the above-described Japanese Patent Application Laid-open No. 2000-182374, when returning the levels of the bit lines BLR, bBLR changed during a floating period to a predetermined level at the time of precharging, the precharge voltage Vbleq is supplied to the bit lines BL, bBL by the switching transistor Q30, and while being in a standby state, a precharge voltage is supplied by the depletion-type current control elements Q20 arranged in parallel. Thus, two types of elements Q20 and Q30 are arranged in parallel for two operations, and therefore the area of elements in the sense amplifier increases accordingly.

Furthermore, in the case that an accessing period to the adjacent memory cell array becomes long and a floating period of the bit line becomes long, a shift of the bit line voltage from the precharge voltage becomes large, and the time to return it to a predetermined voltage by precharging becomes long. However, in the case that a precharge time of refreshing operation is included in a critical path for accessing as in pseudo-SRAM (static random access memory), an access time becomes slow.

SUMMARY OF THE INVENTION

An object of the present invention is to provide a memory device, in which enlargement of the area of elements is suppressed, which is capable of making a precharge characteristic faster at the time of precharging by increasing a current supplied to a bit line, and capable of reducing a standby current while being in a standby state by reducing a DC current originated in cross failure by lowering the supply current.

According to one of the aspects of the present invention, there is provided a memory device which has: a memory cell to store data; a word line to select the memory cell; a bit line connectable to the selected memory cell; a precharge power supply to supply a precharge voltage to the bit line; a precharge circuit to connect or disconnect the precharge power supply to or from the bit line; and a current limiting element to control the magnitude of a current flowing between the precharge power supply and the bit line at least by two steps according to an operation status.

BRIEF DESCRIPTION OF THE DRAWINGS

FIG. 3A is a circuit diagram showing a configuration example of voltage switching circuits, and FIG. 3B is a signal timing chart for describing an operation thereof;

FIG. 13 is a signal timing charge for describing an operation of the fifth and sixth embodiments of the present invention;

DETAILED DESCRIPTION OF THE PREFERRED EMBODIMENTS

First Embodiment

Figure 16:
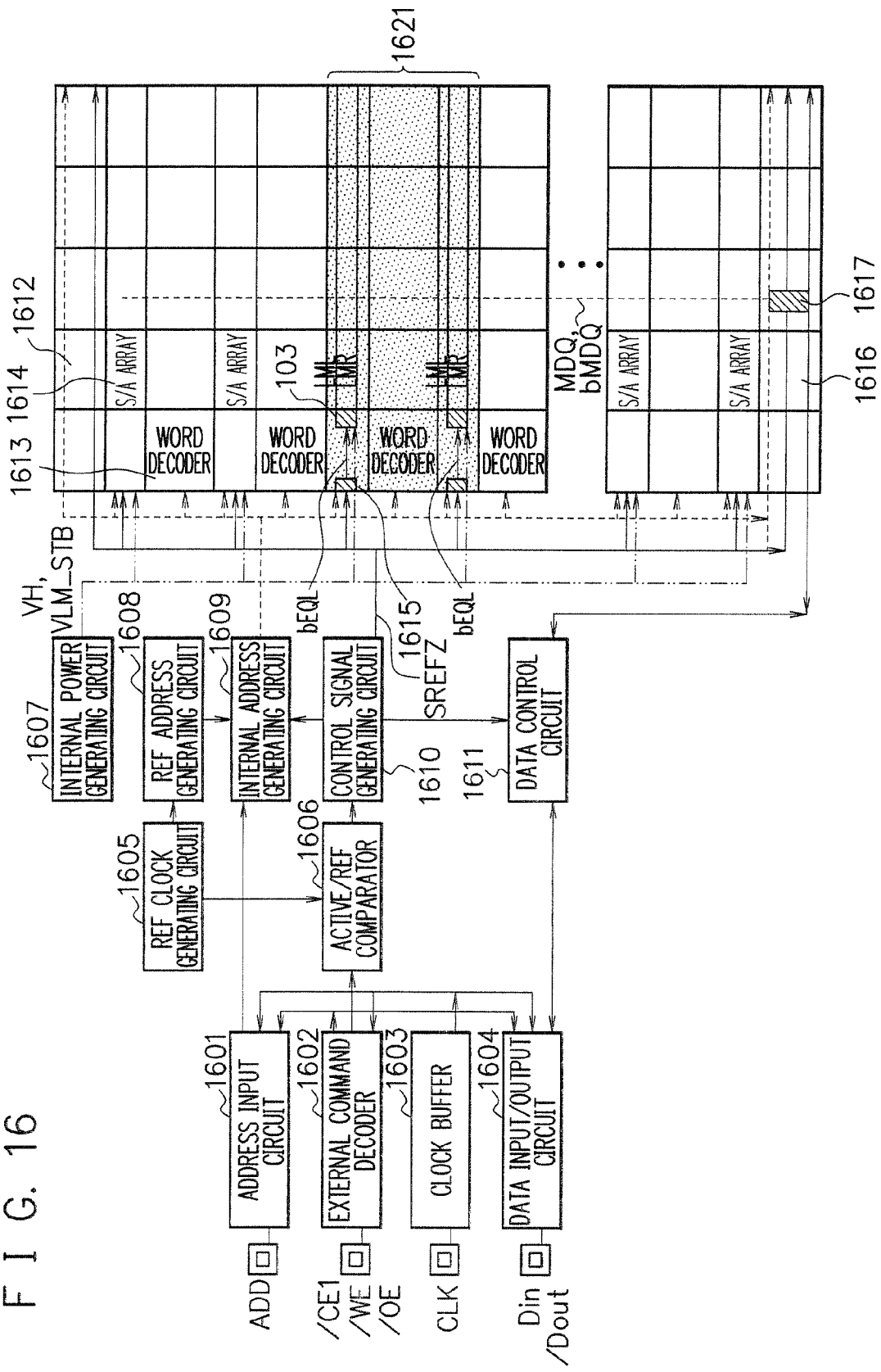
FIG. 16 is a block diagram showing a configuration example of a memory device according to the first embodiment of the present invention.

FIG. 16 is a block diagram showing a configuration example of a memory device according to a first embodiment of the present invention. A clock buffer 1603 inputs a clock CLK and supplies the clock CLK to an address input circuit 1601, an external command decoder 1602 and a data input/output circuit 1604. The external command decoder 1602 inputs external commands such as a chip enable signal /CE1, a write enable signal /WE, an output enable signal /OE, and the like, and outputs commands to the address input circuit 1601 and the data input/output circuit 1604. Specifically, the external command decoder 1602 inputs a write command, a read command, an auto refresh command if the chip has the auto refresh mode, and the like. The address input circuit 1601 inputs an address ADD and outputs address information to an internal address generating circuit 1609. The data input/output circuit 1604 is connected to a data control circuit 1611, inputs write data Din, and outputs read data Dout.

A refresh clock generating circuit 1605 generates a refresh clock for refreshing a memory cell periodically and outputs it to a refresh address generating circuit 1608 and an active/refresh comparator 1606. This memory device has a self refreshing function. The refresh address generating circuit 1608 generates an address to perform refreshing and outputs it to an internal address generating circuit 1609. When an external command (read command, write command, or the like) and self refreshing compete with each other, the active/refresh comparator 1606 gives priority to either one of them and outputs a command to a control signal generating circuit 1610. The control signal generating circuit 1610 outputs a control signal such as a refresh signal SREFZ and the like to the internal address generating circuit 1609, the data control circuit 1611 and the memory cell array. The internal address generating circuit 1609 generates an internal address and outputs it to a column decoder array 1612 and word decoders 1613. The data control circuit 1611 inputs/outputs read data/write data to/from a global data bus amplifier array 1616.

An internal power generating circuit 1607 generates an internal voltage such as a high voltage VH, low voltage VLM_STB, the precharge voltage Vbleq, and the like. In other words, the internal power generating circuit 1607 is also a precharge power supply generating the precharge voltage Vbleq.

Next, the configuration of the memory cell array will be described. The word decoder 1613 supplies a predetermined voltage to the word line WL according to address information. The column decoder array 1612 supplies a predetermined voltage to a column selecting line CSL according to address information. Using the word line WL and a column selecting line CSL, a desired memory cell is selected. A sense amplifier array 1614 amplifies a potential difference between the bit line BL and the complementary line bBL. The complementary bit line bBL is a bit line for generating a reference voltage for a data voltage of the bit line BL before activation of the sense amplifier and generating a complementary voltage to the voltage of the bit line BL after the activation.

A control circuit 1615 inputs a control signal and outputs an access signal via access signal lines bEQL to a voltage switching circuit 103. The voltage switching circuit 103 outputs a predetermined voltage to signal lines LML and LMR. The global data bus amplifier array 1616 is constituted of plural global data bus amplifiers 1617. The global data bus amplifier 1617 precharges global data buses MDQ and bMDQ to high level. An area 1621 is a memory cell array area that is activated by one access.

Figure 1:
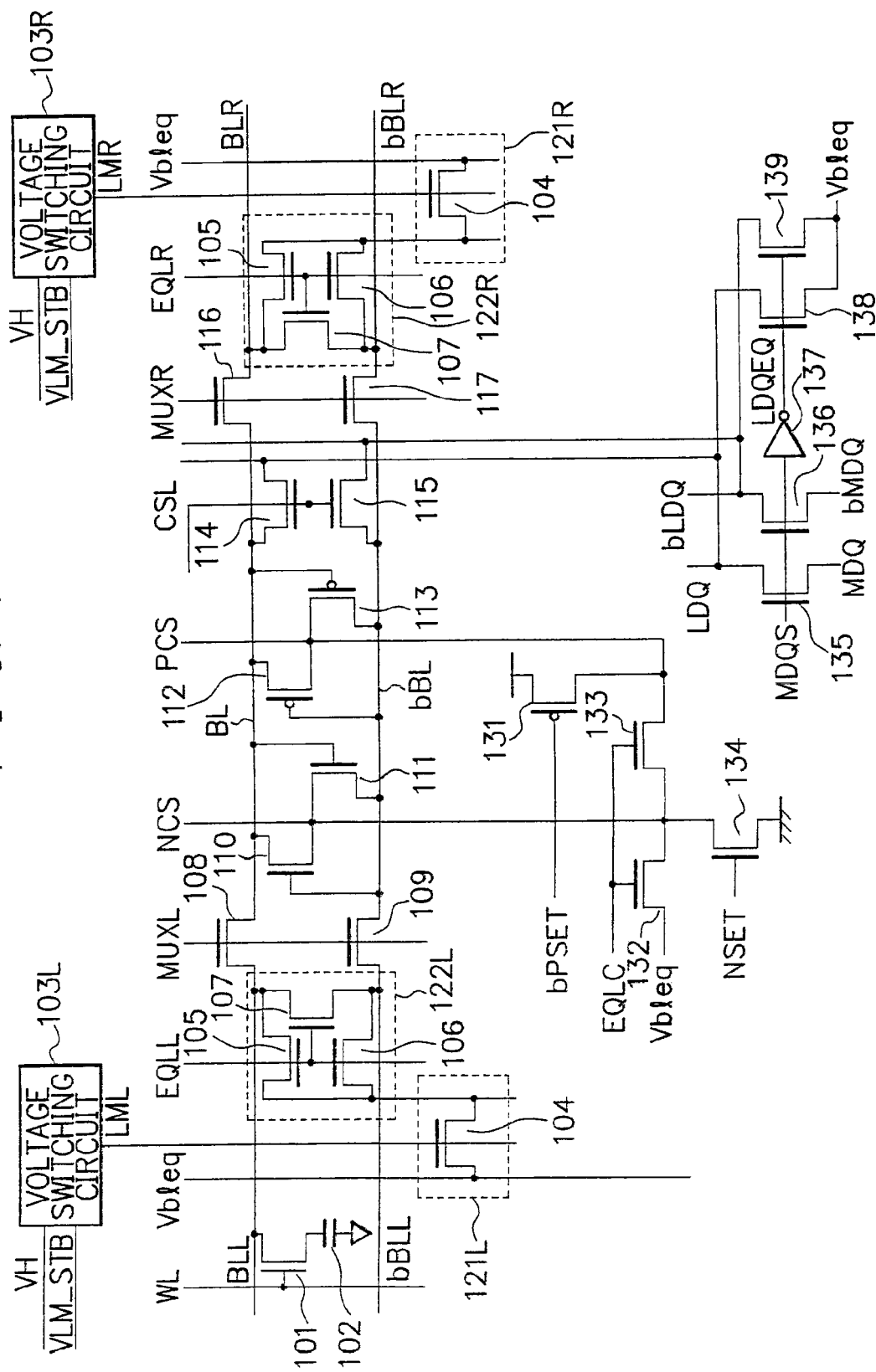
FIG. 1 is a circuit diagram showing a configuration example of a memory cell array according to a first embodiment of the present invention.
Figure 2:
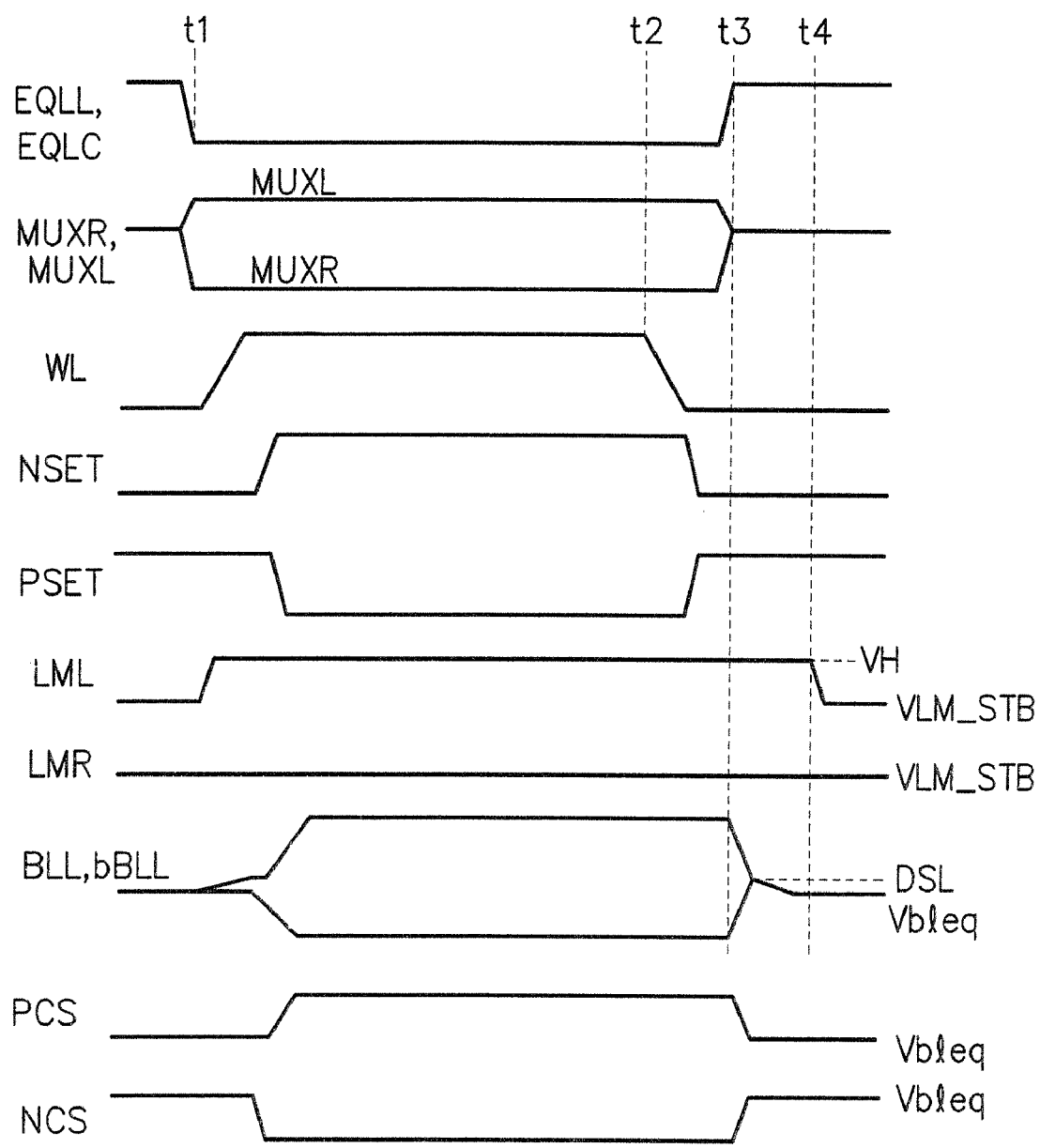
FIG. 2 is a signal timing chart for describing an operation of the first embodiment of the present invention.

FIG. 1 is a circuit diagram showing a configuration example of a memory cell array, and FIG. 2 is a signal timing chart for describing an operation thereof. Hereinafter, MOS (metal-oxide semiconductor) field effect transistor (FET) is simply referred to as transistor. The left area of transistors 108 and 109 is a left memory cell array portion. The right area of transistors 116 and 117 is a right memory cell array portion. The area between them is a shared sense amplifier portion shared by the memory cell array portions on the both sides.

First, the left memory cell array portion will be described. The gate of an n-channel transistor 101 is connected to a word line WL, the drain thereof is connected to a bit line BLL, and a source thereof is connected to a capacitor 102. The n-channel transistor 101 and the capacitor 102 are equivalent to a memory cell. A complementary bit line bBL is a bit line for generating a reference voltage for the data voltage of a bit line BL before activation of the sense amplifier and generating a complementary voltage to the voltage of the bit line BL after the activation. The precharge voltage Vbleq is supplied from the precharge power supply 1607 in FIG. 16. The n-channel transistor 104 constitutes a current limiting element 121L, and the gate thereof is connected to a control line LML, a source thereof is connected to a power supply 1607 for the precharge voltage Vbleq, and the drain thereof is connected to the sources of n-channel transistors 105 and 106. A precharge circuit 122L has n-channel transistors 105, 106, and 107. The gate of the transistor 105 is connected to the control line EQLL, and the drain thereof is connected to the bit line BLL. The gate of the transistor 106 is connected to the control line EQLL, and the drain thereof is connected to the bit line bBLL.

The gate of the transistor 107 is connected to the control line EQLL, and the source/drain thereof are connected to the bit lines BLL/bBLL. A voltage switching circuit 103L selects either one of a high voltage VH and a low voltage VLM_STB and outputs it to a control line LML. The gate of an n-channel transistor 108 is connected to a control line MUXL, and the source/drain thereof are connected to the bit lines BLL/BL. The gate of an n-channel transistor 109 is connected to the control line MUXL, and the source/drain thereof are connected to the bit line bBLL/bBL.

Next, the right memory cell array portion will be described. The right memory cell array potion is basically the same as the left memory cell array portion. Differences will be described below. A current limiting element 121R is constituted of a transistor 104, and a precharge circuit 122R is constituted of transistors 105 to 107. Instead of the bit lines BLL and bBLL, bit lines BLR and bBLR are provided, and instead of the control lines LML and EQLL, control lines LMR and EQLR are provided. A voltage switching circuit 103R selects either one of the high voltage VH and the low voltage VLM_STB and outputs it to the control line LMR. The gate of an n-channel transistor 116 is connected to a control line MUXR, and the source/drain thereof are connected to the bit lines BLR/BL. The gate of an n-channel transistor 117 is connected to the control line MUXR, and the source/drain thereof are connected to the bit lines bBLR/bBL.

Next, the sense amplifier portion will be described. The gate of an n-channel transistor 110 is connected to the bit line bBL, the drain thereof is connected to the bit line BL, and the source thereof is connected to the signal line NCS. The gate of an n-channel transistor 111 is connected to the bit line BL, the drain thereof is connected to the bit line bBL, and the source thereof is connected to a signal line NCS. The gate of a p-channel transistor 112 is connected to the bit line bBL, the drain thereof is connected to the bit line BL, and the source thereof is connected to a signal line PCS. The gate of a p-channel transistor 113 is connected to the bit line BL, the drain thereof is connected to the bit line bBL, and the source thereof is connected to the signal line PCS.

The gate of a p-channel transistor 131 is connected to a control line bPSET, the source thereof is connected to a power supply voltage, and the drain thereof is connected to the signal line PCS. The gate of an n-channel transistor 134 is connected to a control line NSET, the source thereof is connected to the ground, and the drain thereof is connected to the signal line NCS. The gate of an n-channel transistor 132 is connected to a control line EQLC, the drain thereof is connected to the precharge voltage Vbleq, and the source thereof is connected to the signal line NCS. The gate of an n-channel transistor 133 is connected to the control line EQLC, the source thereof is connected to the signal line NCS, and the drain thereof is connected to the signal line PCS.

The gate of an n-channel transistor 114 is connected to the column selecting line CSL, the drain thereof is connected to the bit line BL, and the source thereof is connected to a local data bus LDQ. The gate of an n-channel transistor 115 is connected to the column selecting line CSL, the drain thereof is connected to the bit line bBL, and the source thereof is connected to a local data bus bLDQ.

The gate of an n-channel transistor 135 is connected to the control line MDQS, the drain thereof is connected to the local data bus LDQ, and the source thereof is connected to the global data bus MDQ. The gate of an n-channel transistor 136 is connected to the control line MDQS, the drain thereof is connected to the local data bus bLDQ, and the source thereof is connected to the global data bus bMDQ. An inverter 137 outputs a logically inverted signal of the control line MDQS to a control line LDQEQ. The gates of the n-channel transistors 138 and 139 are connected to the control line LDQEQ, and the drains thereof are connected to the precharge voltage Vbleq. The sources of the transistors 138 and 139 are connected to the local data buses LDQ and bLDQ respectively.

The n-channel transistor 101 and the capacitor 102 constituting a memory cell can store data. The word line WL can select the n-channel transistor 101 and the capacitor 102 of the memory cell. The bit line BL is connectable to the selected memory cell capacitor 102. The precharge power supply 1607 can supply the precharge voltage Vbleq to the bit lines BLL, bBLL, and so on. The precharge circuits 122L and 122R connect or disconnect the precharge power supply 1607 to or from the bit lines BLL, bBLL, and the like. According to the high voltage VH or the low voltage VLM_STB, the current limiting elements 121L and 121R control the magnitude of a current flowing between the precharge power supply 1607 and the bit lines BLL, bBLL at least in two steps.

Next, an operation of the circuit in FIG. 1 will be described with reference to FIG. 2. Before time t1, it is in standby state. The sense amplifier drive line precharge signal line EQLC are signal lines which become low level when either one of the control lines EQLL and EQLR becomes low level. The bit lines BLL and bBLL are charged by the precharge voltage Vbleq.

When an access (read or write) or refresh request comes to the left memory cell array at time t1, an activating operation and a precharging operation are performed as described below.

In activating operation, first, the bit line precharge signal line EQLL on the left side turns to low level, the transfer gate signal line MUXL on the left side turns to high level, and the transfer gate signal line MUXR on the right side turns to low level. The bit lines BLL, bBLL of the left memory cell array being accessed are connected to the bit lines BL, bBL of the sense amplifier. The bit lines BL, bBLR of the right memory cell array and the bit lines BL, bBL of the sense amplifier are disconnected from each other. Since the control line EQLL is low level, the precharge circuit 122L turns off, and the bit lines BLL, bBLL are disconnected from the recharge power supply 1607.

Next, the word line WL turns to high level, and a data signal of the cell 102 is supplied to the bit line BLL. When the capacitor 102 stores high level, the voltage of the bit line BLL rises, and when the capacitor 102 stores low level, the voltage of the bit line BLL drops. Next, the control line NSET turns to high level and the control line bPSET turns to low level, and they supply a voltage VBLH (high level writing voltage for a memory cell) and a ground voltage to the sense amplifier drive lines PCS and NCS respectively. Then, the sense amplifier is activated and amplifies the potential difference between the bit lines BLL and bBLL to the voltage VBLH and the ground voltage. In response to the change of the control line EQLL to low level for example during these activating operations, the gate signal line LML of the current limiting element 121L on the left side is switched to the high voltage VH.

By turning the column selecting line CSL to high level and the control line MDQS to high level, the voltages of the bit lines BLL, bBLL are outputted to the global data buses MDQ, bMDQ.

When a precharging operation starts at time t2, first the word line WL turns to low level, and the memory cell 102 and the bit line BLL are disconnected. Next, the control line NSET turns to low level and the control line bPSET turns to high level, and the activation of the sense amplifier stops.

At time t3, the control line EQLL turns to high level, and the bit lines BLL, bBLL are started to be connected to the precharge power supply 1607. The precharge circuit 122L equalizes the bit lines BLL and bBLL and at the same time supplies the precharge voltage Vbleq to the bit lines BLL and bBLL. Further, the control line EQLC turns to high level and precharges the sense amplifier drive lines PCS and NCS to the precharge voltage Vbleq.

In FIG. 2, for convenience in description, shown is the case that the precharge voltage Vbleq is set lower than the direct short level (hereinafter, referred to as DSL) of the bit lines BLL and bBLL, but the precharge voltage Vbleq may be the same voltage as the DSL. The control line EQLL becomes high level, and the complementary bit lines BLL and bBLL are equalized with the DSL, but are still at different level from the precharge voltage Vbleq. At this time, the precharge voltage Vbleq is supplied to the bit lines BLL, bBLL via the current limiting element 121L, but the voltage of the gate line LML of the current limiting element 121L is the high voltage VH which has relatively larger supplying ability, so that the operation of equalizing the bit lines ELL and bBLL with the precharge voltage Vbleq can be made faster. By setting the gate line LML to the high voltage VH, the current flowing in the current limiting element 121L can be made relatively larger. Accordingly, precharging immediately after accessing is made faster, and the next access start time can be made faster.

At time t4 where a predetermined period has passes from the precharge start time t3, the voltage of the gate line LML is switched to the low voltage VLM_STB. If the same voltage as the precharge voltage Vbleq is used as the voltage of the low voltage VLM_STB for example, the voltage Vgs between the gate and source of the current limiting element 121L becomes approximately 0 (zero) V after the voltage of the gate line LML is switched to the low voltage VLM_STB, and the supplying ability becomes relatively small. However, if the voltage of the bit lines BLL, bBLL tries to shift from the precharge voltage Vbleq due to a shifting factor such as a junction leakage current, setting of the low voltage VLM_STB not to the ground but to the precharge voltage Vbleq makes the voltage Vgs>0 (zero) V between the gate and source of the current limiting element 121L and the voltage Vds>0 (zero) V between the drain and source thereof, and then some amount of off current can be supplied. Therefore, the voltage of the bit lines BLL and bBLL can be maintained at the precharge voltage Vbleq. From this point of view, the necessary conditions for the characteristic of the current limiting element 121L and the low voltage VLM_STB are such that, in the standby state, the shifting factor of the bit lines BLL and bBLL such as a junction leakage current is compensated by the off current of the current limiting element 121L and the bit line voltage is maintained at the precharge voltage Vbleq, and the low voltage VLM_STB is not limited to the recharge voltage Vbleq.

By setting the gate line LML to the low voltage VLM_STB, the current flowing in the current limiting element 121L can be relatively small. Accordingly, a standby current in the case that there is an insulation failure between the word line WL and the bit line BLL can be made small. While being in the standby state, the word line WL is low level, and the bit line BLL is the precharge voltage Vbleq. When the word line WL and the bit line BLL short circuit with each other, a current flows from the bit line BLL to the word line WL. This current is set by the low voltage VLM_STB to be controlled at a predetermined value and to be small by the current limiting element 121L. Accordingly, the standby current can be made small and the power consumption can be made small. Incidentally, the above-described memory cell in short circuit is not used, and a redundant memory cell is used instead. Further, if there is an insulation failure between the word line WL and the bit line BLL, a leakage current flows from the bit line BLL to the word line WL. The current limiting element 121L is capable of making the leakage current small and making the standby current small.

FIG. 3A is a circuit diagram showing a configuration example of the voltage switching circuits 103L and 103R in FIG. 1, and FIG. 3B is a signal timing chart for describing an operation thereof. A signal line bEQLL is an access signal line which indicates, when it is high level, that accessing is performed. An inverter 301 outputs a voltage made by logically inverting the voltage of the signal line bEQLL to the signal line EQLL. The delay circuit 302 delays the signal of the signal line bEQLL by time Ta and outputs it. An inverter 303 logically inverts an output signal of the delay circuit 302 and outputs it to the gate of a p-channel transistor 304. The source of the transistor 304 is connected to the high voltage VH, and the drain thereof is connected to the control line LML. The gate of a p-channel transistor 305 is connected to the output of the delay circuit 302, the source thereof is connected to the control line LML, and the drain thereof is connected to the low voltage VLM_STB. For example, the high voltage VH is 1.6 V, and the low voltage VLM_STB is 0.8 V. After time Ta passes from the start of precharging, the control line LML can be switched from the high voltage VH to the low voltage VLM_STB. In the above, the voltage switching circuit 103L is described, but the voltage switching circuit 103R has the same configuration.

This example shows the case of generating the switching timing of the voltage of the control line LML by delaying the control line bEQLL by the delay circuit 302. The correspondence of the control line LML/LMR to the cell arrays 311L/311R is the same as that of the control lines EQLL/EQLR, and a charging/discharging current at the gates of the current limiting elements 121L/121R is suppressed by switching the voltage of the control lines LML/LMR of only the cell array that is being accessed. In the drawing, an example of separately arranging the delay circuit 302 of the voltage switching circuit 103L and the delay circuit 302 of the voltage switching circuit 103R is shown, but the delay circuits 302 of the both may be a shared one. Further, it is possible to arrange the delay circuit 302 outside the memory cell array to be shared by plural blocks and input the delay timing signal to the memory cell array to thereby reduce the area of the delay circuit. Further, regarding the arranging location of the voltage switching circuits 103L, 103R, they may be arranged, for example, at an area where a main word decoder array and a sense amplifier array cross each other, or at an area where a sub word decoder array or a word strap area and a sense amplifier array cross each other.

Figure 4C:
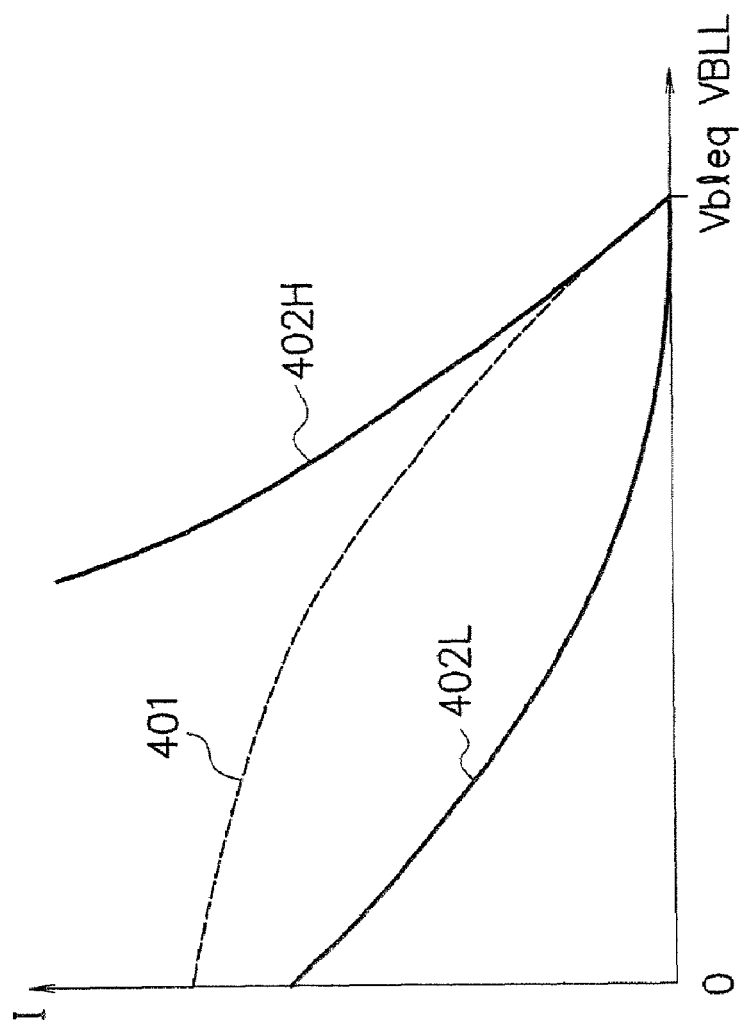
FIG. 4A to FIG. 4C are diagrams showing a current of a current limiting element according to the first embodiment of the present invention.
Figure 4A:
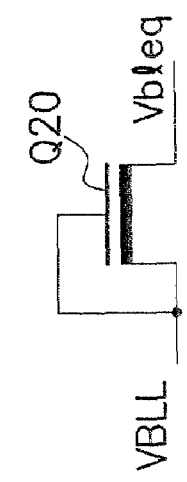
Figure 14:
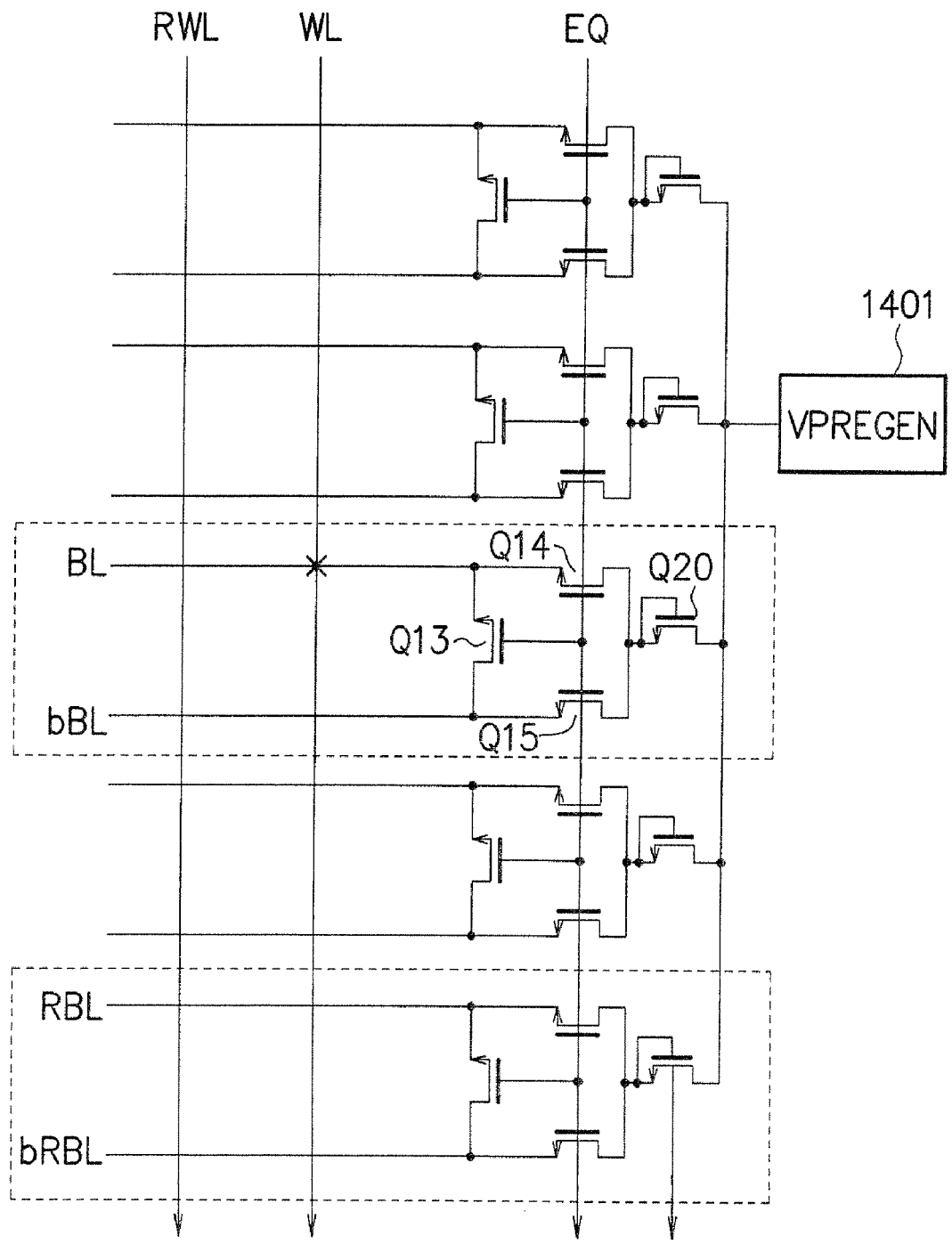
FIG. 14 is a circuit diagram of DRAM.
Figures 15A, 15B:
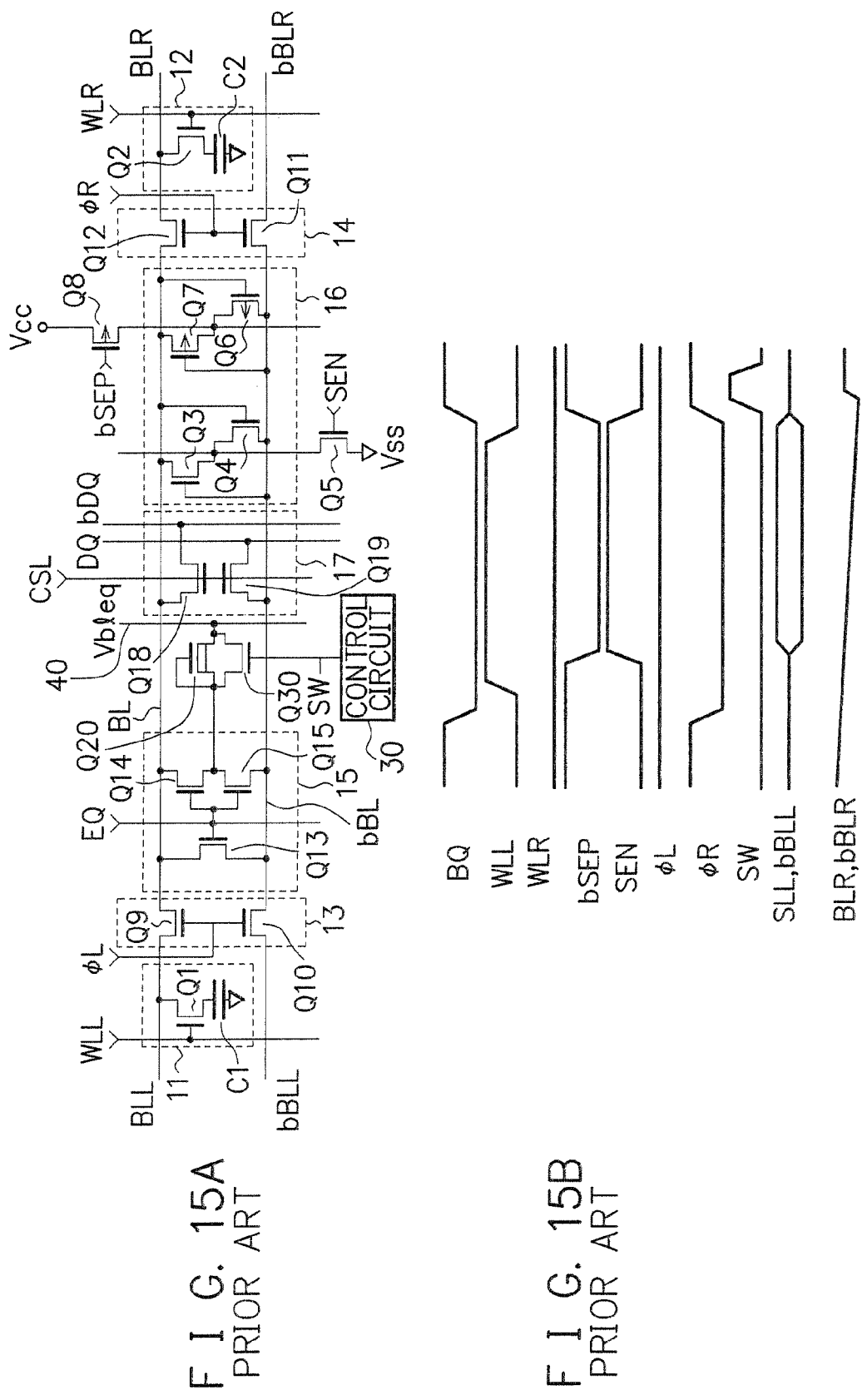
FIG. 15A and FIG. 15B are a circuit diagram of another DRAM and a signal waveform diagram respectively.

FIG. 4A shows the configuration of the current limiting element Q20 in FIG. 14 and FIG. 15A. The current limiting element Q20 is a depletion type n-channel transistor, in which a current I flows from the precharge voltage Vbleq to the bit line voltage VBLL. The gate of the transistor Q20 is connected to the bit line BLL and becomes a voltage VBLL. The bit line voltage VBLL is the voltage of the bit line BLL.

Figure 4B:
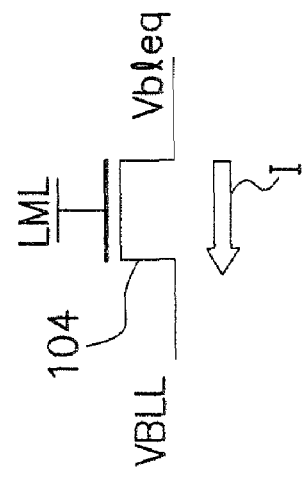

FIG. 4B shows the configuration of the current limiting element 104 in FIG. 1 of this embodiment. In the current limiting element 104, a current I flows from the precharge voltage Vbleq to the bit line voltage VBLL. The gate of the transistor 104 is connected to the control line LML. To the control line LML, the relatively higher voltage VH or the relatively lower voltage VLM_STB is supplied.

FIG. 4C is a graph showing a relationship between the bit line voltage VBLL of the current limiting element and the current I in FIG. 4A and FIG. 4B. A characteristic 401 shows the characteristic of the current limiting element Q20 in FIG. 4A. A characteristic 402H is a characteristic at the time of supplying the high voltage VH to the gate line LML of the current limiting element 104 in FIG. 4B. A characteristic 402L is a characteristic at the time of supplying the low voltage VLM_STB to the gate line LML of the current limiting element 104 in FIG. 4B.

In this embodiment, at the time of starting precharge of the bit lines, the gate line LML is set to the voltage VH that is relatively higher than that in a standby state as shown by the characteristic 402H to thereby enable supplying of the precharge voltage larger than the characteristic 401 and making the precharging operation faster. Further, in the standby state in this embodiment, as shown by the characteristic 402L, the gate line LML is set to the voltage VLM_STB that is relatively low, for example the precharge voltage Vbleq, to thereby enable limiting of the current supplied to the bit lines BLL, bBLL effectively as compared to the characteristic 401 even when the bit line voltage VBLL is decreased by cross failure of the word line WL and the bit line BLL. Incidentally, as described above, the current value when the bit line voltage VBLL at the time that the voltage of the gate line LML is set to the low voltage VLM_STB is in the vicinity of the precharge voltage Vbleq is set equal to or larger than a current capable of compensating the shifting factor of the bit line such as junction leakage current. Specifically, the low voltage VLM_STB is set such that a current value capable of suppressing a shift of the voltage of a bit line from the precharge voltage Vbleq due to the junction leakage current flows in the current limiting element.

Second Embodiment

Figure 5A:
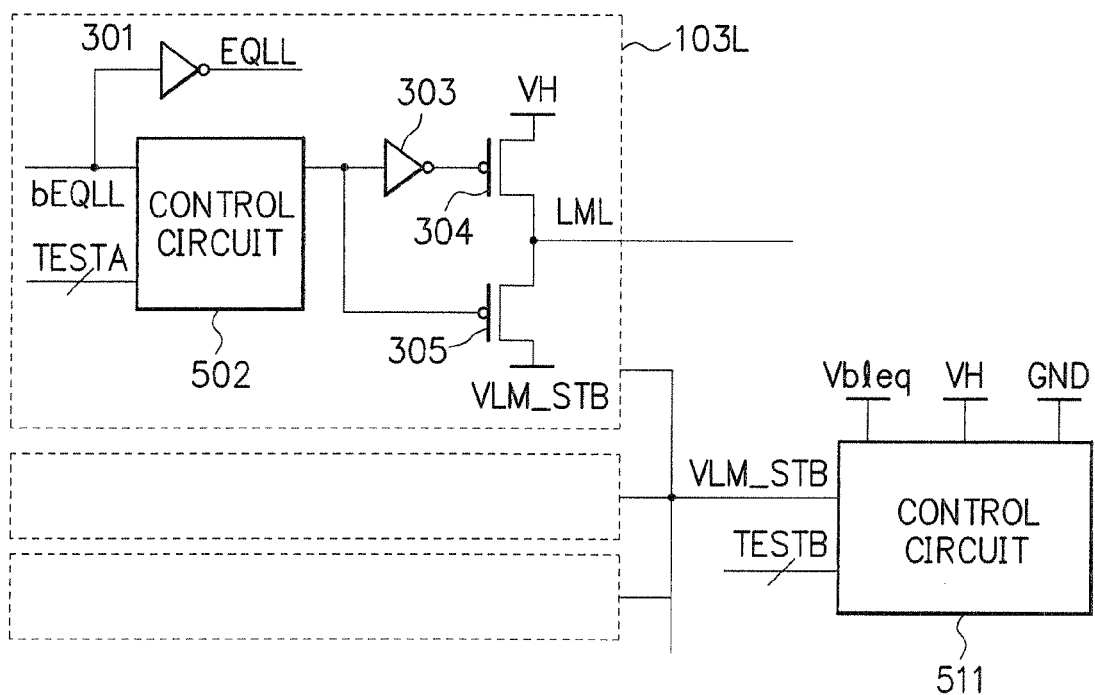
FIG. 5A and FIG. 5B are circuit diagrams showing configuration examples of a voltage switching element according to a second embodiment of the present invention.

FIG. 5A is a circuit diagram showing a configuration example of a voltage switching circuit 103L according to a second embodiment of the present invention, and the configuration of a voltage switching circuit 103R is the same. In this embodiment, as compared to the first embodiment (FIG. 3A), a control circuit 502 to which a signal TESTA of plural bits is inputted and a control circuit 511 to which a signal TESTB of plural bits is inputted are added.

When the signal TESTA is asserted, the control circuit 502 fixes the voltage of a gate line LML to either one of a high voltage VH and a low voltage VLM_STB. Accordingly, in a test, it is possible to facilitate an accelerated test in which a precharge voltage Vbleq is constantly supplied to bit lines BLL, bBLL to change the precharge voltage Vbleq to thereby reject a cell with bad condition. Incidentally, in the control circuit 511, the low voltage VLM_STB can be set to the same voltage as the precharge voltage Vbleq.

The control circuit 511 is a circuit for changing and generating the low voltage VLM_STB according to the signal TESTB. The control circuit 511 is preferred to include a means of correcting the level of low voltage VLM_STB automatically by arranging a replica and monitoring the ability of the current limiting element 104 or by constructing the circuit in FIG. 5B so that when the ability of the current limiting element 104 shifts from a set value due to manufacturing variability, the effect thereof becomes small.

Figure 5B:
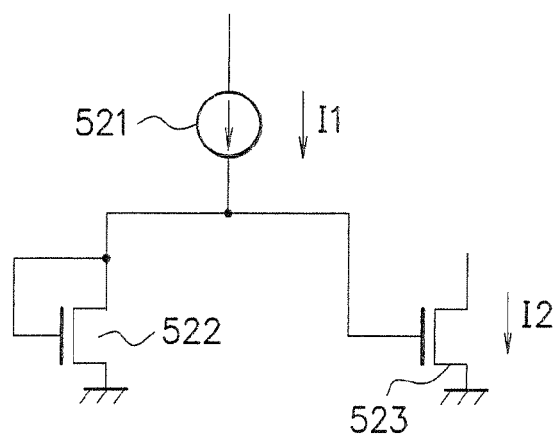

FIG. 5B is a circuit using a current mirror circuit and an n-channel transistor. The gate and the drain of the n-channel transistor 522 are connected to a constant current source 521, and the source thereof is connected to the ground. The gate of an n-channel transistor 523 is connected to the constant current source 521 and the source thereof is connected to the ground. The gates of transistors 522 and 523 are connected to each other to constitute a current mirror circuit. With respect to manufacturing variability in threshold values of n-channel transistors, variability of a current I2 flowing in the n-channel transistor 523 at the last stage can be reduced. Further, a current I1 flowing in the constant current source 521 is generated by a band gap reference circuit so that the current I1 itself is not affected by the variability in the threshold values of the n-channel transistors. In this embodiment, variability of current in the current limiting element 104 can be reduced.

Further, when the signal TESTB is asserted, the control circuit 511 can change the low voltage VLM_STB within a range of movement (a range from a voltage VH to the ground GND) set in advance. Preferably, the signal TESTB is configured to be settable not only by a metal switch, but also by a test mode or a fuse to reflect evaluation results after a wafer process finishes. With the above described configuration, a cell having a bad condition can be efficiently detected to use a redundant memory cell, or the voltage of the low voltage VLM_STB can be optimized to thereby improve a manufacturing yield and testing efficiency.

Third Embodiment

Figure 6:
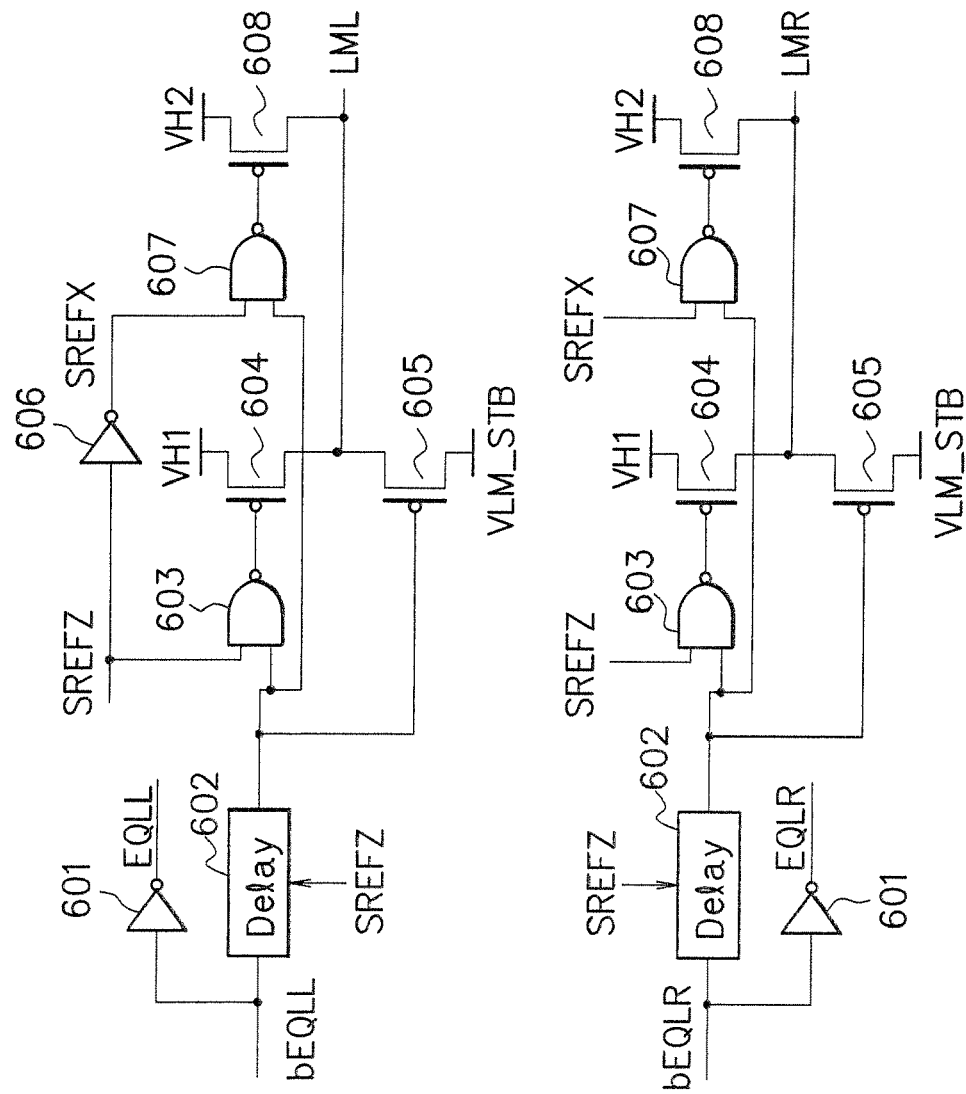
FIG. 6 is a circuit diagram showing configuration examples of voltage switching circuits according to a third embodiment of the present invention.

FIG. 6 is a circuit diagram showing configuration examples of voltage switching circuits 103L and 103R according to a third embodiment of the present invention. In this embodiments a high voltage VH at the time of starting precharge is divided into two types. A high voltage VH1 at the time of self refreshing is made lower than a high voltage VH2 at the time of accessing (reading or writing).

Figure 7C:
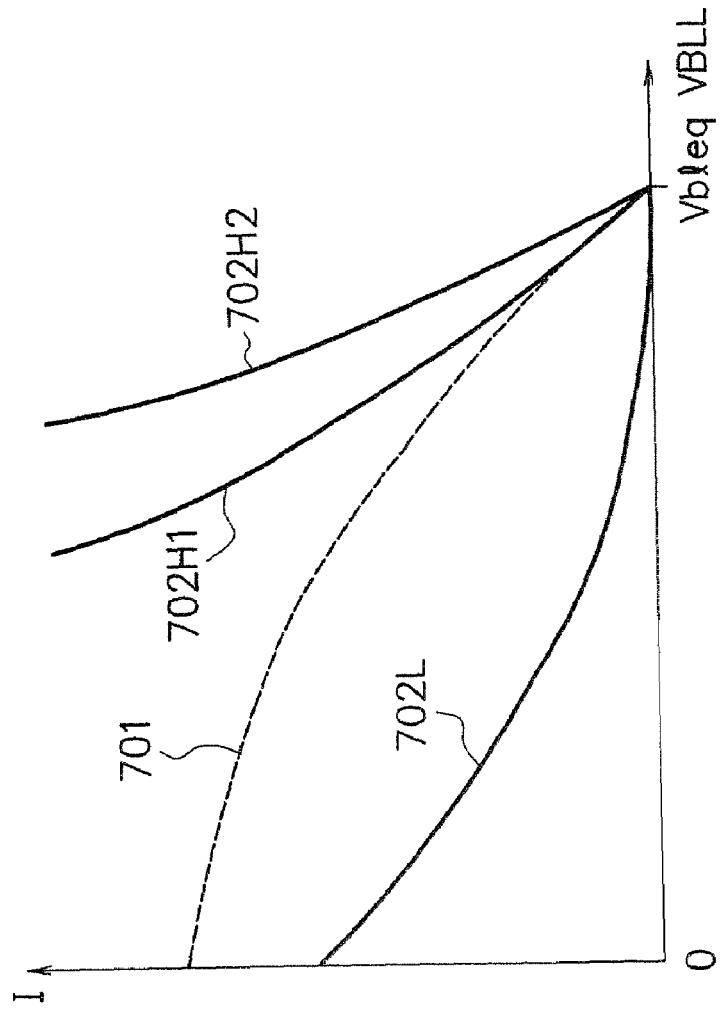
FIG. 7A to FIG. 7C are diagrams showing a current of a current limiting element according to the third embodiment of the present invention.
Figure 7A:
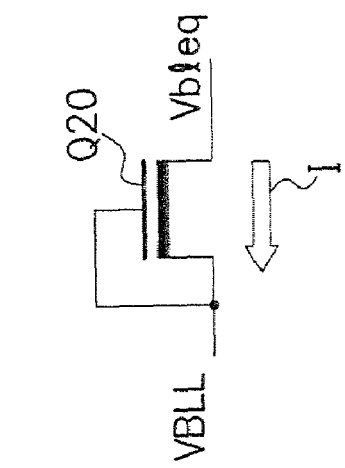
Figure 7B:
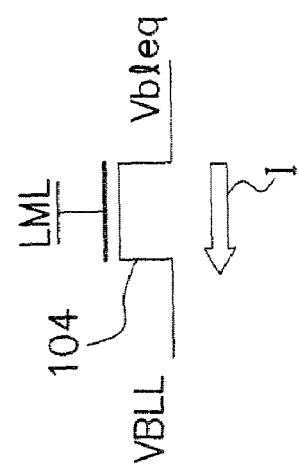
Figure 8:
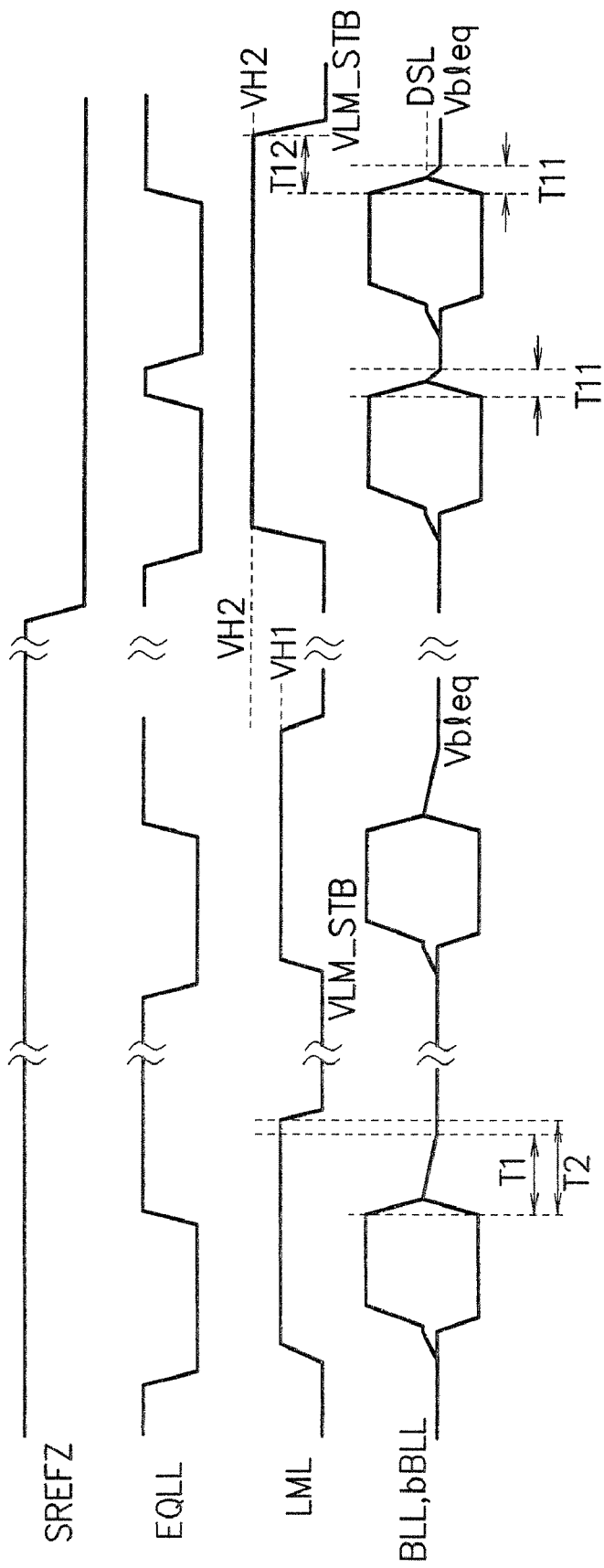
FIG. 8 is a signal timing chart for describing an operation of the third embodiment of the present invention.

FIG. 7A to FIG. 7C shows a relationship between a bit line voltage VBLL of a current limiting element and a current I according to this embodiment FIG. 8 is a signal timing chart for describing an operation of this embodiment.

In FIG. 6, an inverter 601 outputs a voltage made by logically inverting the voltage of a signal line bEQLL to a signal line EQLL. A delay circuit 602 delays a signal of the signal line bEQLL according to the signal of a self refresh signal line SREFZ and outputs it. A self refresh signal line SREFZ denotes a self refreshing operation when it is high level, and denotes an accessing operation when it is low level. As shown in FIG. 8, the delay circuit 602 makes a delay time T2 relatively longer when the self refresh signal line SREFZ is high level, and makes a delay time T12 relatively shorter when the self refresh signal line SREFZ is low level. In the self refreshing operation, the voltage VH1 of the gate line LML is relatively low, which makes precharge time T1 long, so that the delay time T2 should be made long. On the contrary, in the accessing operation, the voltage VH2 of the gate line LML is relatively high, which makes precharge time T11 short, so that the delay time T12 may be made short. Incidentally, in the case where it would not be a problem to set the delay time to be the same as the delay time T2 at the time of self refreshing operation having a long precharge time without switching the delay time for the self refreshing operation and the accessing operation, the logic of delay circuit can be simplified by setting so.

A Negative-AND (NAND) circuit 603 inputs the outputs of the signal line SREFZ and the delay circuit 602 and outputs a NAND signal of them. The gate of a p—channel transistor 604 is connected to the output of the NAND circuit 603, the source thereof is connected to the high voltage VH1, and the drain thereof is connected to the gate line LML. The gate of the p-channel transistor 605 is connected to the output of the delay circuit 602, the source thereof is connected to the control line LML, and the drain thereof is connected to a low voltage VLM_STB.

The inverter 606 outputs a signal made by logically inverting the signal of the self refresh signal line SREFZ to a signal line SREFX. A NAND circuit 607 inputs the outputs of the signal line SREFX and the delay circuit 602 and outputs a NAND signal of them. The gate of a p-channel transistor 608 is connected to the output of the NAND circuit 607, the source thereof is connected to the high voltage VH2, and the drain thereof is connected to the gate line LML. In the above, the voltage switching circuit 103L is described, but the voltage switching circuit 103R has the same configuration.

Similarly to FIG. 4A, FIG. 7A shows the configuration of the current limiting element Q20 in FIG. 14 and FIG. 15A. Similarly to FIG. 4B, FIG. 7B shows the configuration of the current limiting element 104 in FIG. 1 of this embodiment. The gate of the transistor 104 is connected to the control line LML. The control line LML becomes the voltage VLM_STB at the time of standby, becomes the voltage VH1 at the time of starting precharge in a refreshing operation, and becomes the voltage VH2 at the time of starting precharge in an accessing operation.

FIG. 7C is a graph showing a relationship between a bit line voltage VBLL of the current limiting elements in FIG. 7A and FIG. 7B and a current I. A characteristic 701 shows the characteristic of the current limiting element Q20 in FIG. 7A. A characteristic 702L is the characteristic at the time of supplying the low voltage VLM_STB to the gate line LML of the current limiting element 104 in FIG. 7B. A characteristic 702H1 is the characteristic when supplying the high voltage VH1 to the gate line LML of the current limiting element 104 in FIG. 7B. A characteristic 702H2 is the characteristic at the time of supplying the high voltage VH2 to the gate line LML of the current limiting element 104 in FIG. 7B.

In a standby state in which only the self refreshing operation is performed consecutively, the interval between refreshing operations is generally in microsecond order, which is adequately long as compared to an interval of normal accessing operations which is in nanosecond order. Accordingly, the precharging operation at the time of self refreshing is not needed to be very fast, so that when the self refresh signal line SREFZ denoting that a self refreshing operation is performed consecutively becomes high level, the voltage VH1 lower than the voltage VH2 is supplied to the gate line LML to suppress a charging/discharging current at the gate of the current limiting element 104. Also in this case, a period T2 in which the gate line LML is being the voltage VH1 is set with consideration of the time to equalize the bit lines BLL and bBLL with the precharge voltage Vbleq by precharging. When an access command such as read, write, auto refresh if the chip has the auto refresh mode, or the like is inputted externally, the self refresh signal line SREFZ supplies the voltage VH2 higher than the voltage VH1 as low level to the gate line LML to increase the current that can be supplied at the time of precharging, thereby shortening the precharge time as well as the access and cycle time. On the gate line LML, when the refresh signal line SREFZ is low level and reading or writing is consecutively performed, the high voltage VH2 is maintained during this period.

Here, in the case of pseudo-SRAM a self refresh request inside a semiconductor chip and an external command request occur at random timing, and thus it is possible that the self refreshing is performed just when an external command is inputted. A route from inputting an external command to switching the voltage of the gate line LML from the voltage VH1 to the voltage VH2 is shortened in advance so that the voltage is switched to the voltage VH2 before releasing precharge of an access block, and thus the bit line of the block that is refreshed can be equalized with the precharge voltage Vbleq by the precharge. Further, in the case of pseudo-SRAM, the self refresh request constantly occurs in a normal use condition, and therefore when the signal line SREFZ is configured to be low level in a state that no self refreshing is performed since an access entered, the signal line SREFZ denotes, when it is low level, a period of active state or a period just after entering a standby state. The latter period is adequately short for the overall standby period, and in the case that the standby current barely increases by averaging a cross failure current without reducing it in this short period, it is also possible not to return the gate line LML from the voltage VH2 to the voltage VLM_STB but to set the gate line LML to the voltage VH2 constantly while the signal line SREFZ is being low level. Accordingly, the charging/discharging current at the gate of the current limiting element 104 in an active state can be reduced. However, if plural gate lines LML maintained at the voltage VH2 are returned to the voltage VLM_STB at once after entering the standby state and the signal line SREFZ becomes high level, load on the power supply of the voltage VLM_STB increases, so that measures such as allowing the timing of returning to the voltage VLM_STB to shift, increasing the power supplying ability temporarily, and the like are taken.

In the above-described embodiments, the signal line LML is added as the gate signal of the current limiting element 104. Hereinafter, embodiments characterized by using existing signals related to a sense amplifier for all the signals so that the wiring area and the element area of the sense amplifier do not increase will be described.

Fourth Embodiment

Figure 9:
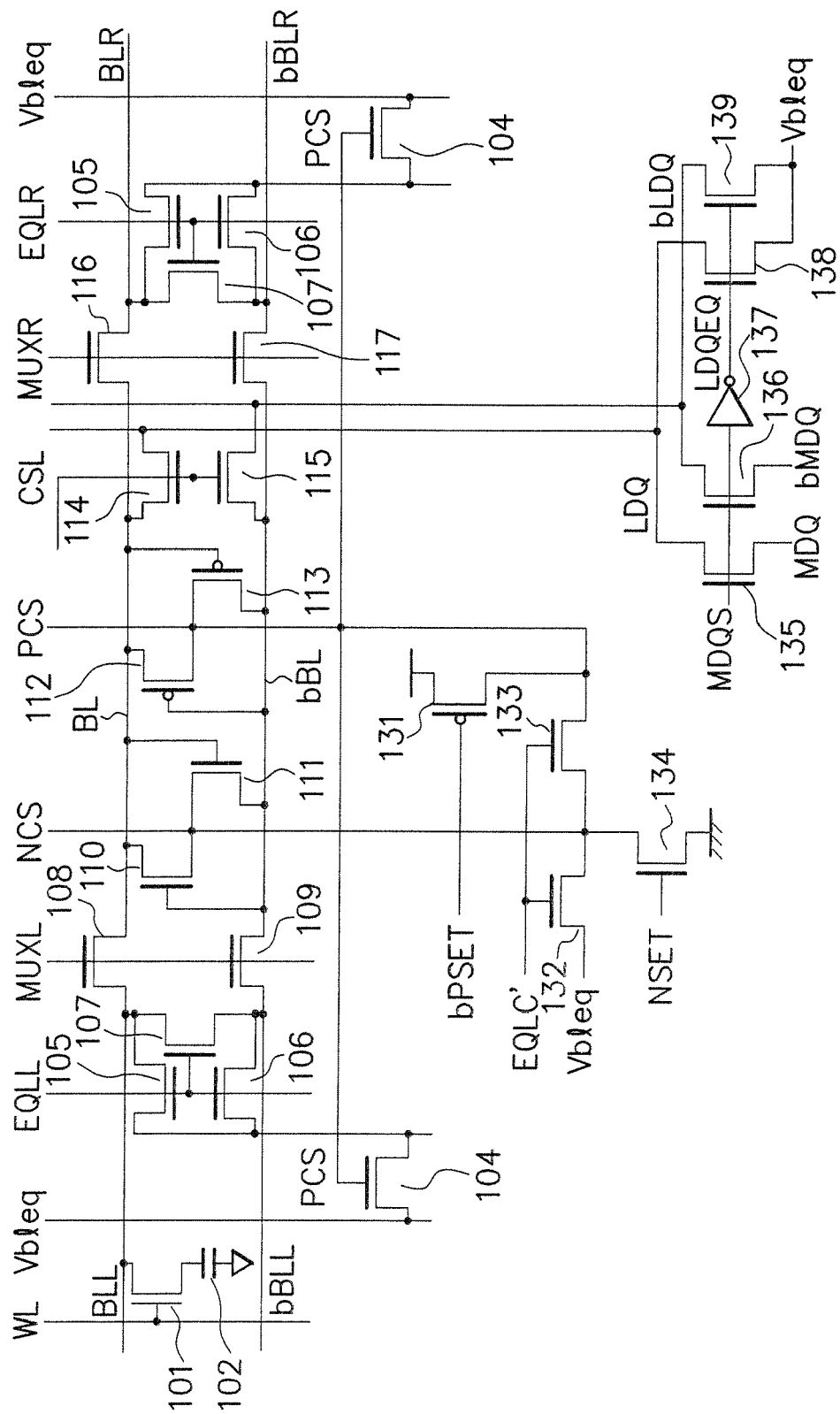
FIG. 9 is a circuit diagram showing a configuration example of a memory cell array according to a fourth embodiment of the present invention.
Figure 10:
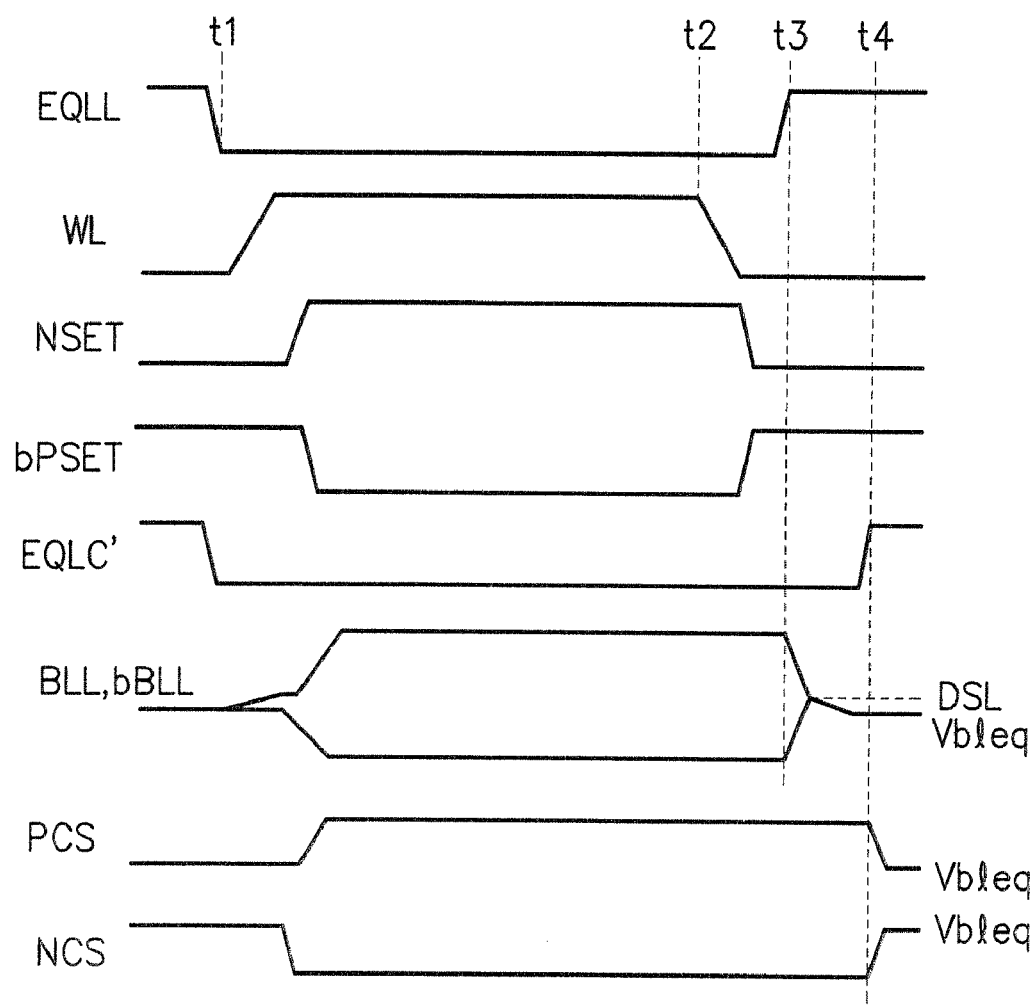
FIG. 10 is a signal timing chart for describing an operation of the fourth embodiment of the present invention.

FIG. 9 is a circuit diagram showing a configuration example of a memory cell array according to a forth embodiment of the present inventions, and FIG. 10 is a signal timing chart for describing an operation thereof. Differences of this embodiment in FIG. 9 from the first embodiment in FIG. 1 will be described. To the gates of the current limiting elements 104, a signal line PCS is connected. Accordingly, the gate voltage of the current limiting elements 104 becomes the same as the voltage for driving the sense amplifier. A control line EQLC' in FIG. 9 is provided to replace the control line EQLC in FIG. 1 and connected to the gates of transistors 132 and 133.

Timing t4 at which the precharge signal line EQLC' for precharging sense amplifier driving lines NCS, PCS turns to high level is delayed from bit line precharge starting timing t3 at which the signal line EQLL turns to high level. Thus, at the start of precharging the bit line, the gate line PCS of the current control element 104 becomes high level for a predetermined period t3 to t4. After time t4, the control line EQLC' turns to high level, and the gate line PCS of the current limiting elements 104 becomes the precharge voltage Vbleq. Here, in the case where a precharging operation of the sense amplifier drive line is performed later than the precharge of the bit line, the delay from turning of the control line EQLL to high level to turning of the control line EQLC' to high level can be eliminated.

Fifth Embodiment

Figure 11:
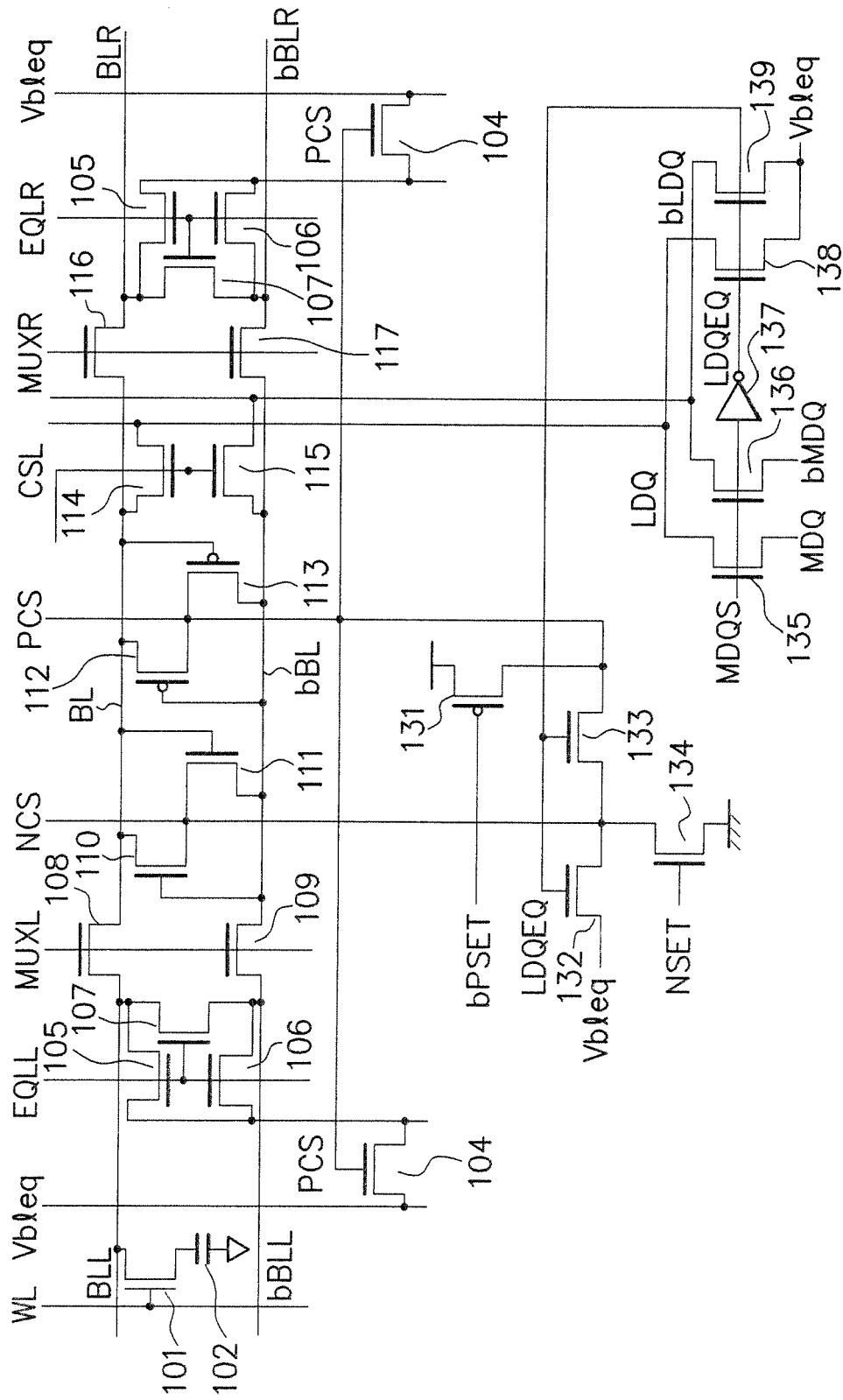
FIG. 11 is a circuit diagram showing a configuration example of a memory cell array according to a fifth embodiment of the present invention.

FIG. 11 is a circuit diagram showing a configuration example of a memory cell array according to a fifth embodiment of the present invention, and FIG. 13 is a signal timing chart for describing an operation thereof. Differences of this embodiment in FIG. 11 from the fourth embodiment in FIG. 9 will be described. To the gates of transistors 132 and 133, a recharge signal line LDQEQ of a data bus is connected. The voltage of the control line LDQEQ for precharging the sense amplifier drive lines PCS, NCS is generated based on the voltage of the control line MDQS for data bus switches 135, 136.

Global data buses MDQ, bMDQ and local data buses LDQ, bLDQ are data buses for inputting or outputting the voltages of bit lines BL, bBL to/from the outside. The data bus switches 135 and 136 can connect the global data buses MDQ, bMDQ to the bit lines BL, bBL via the local data buses LDQ, bLDQ.

In the fourth embodiment, the precharge signal line EQLC' for the sense amplifier drive lines PCS, NCS are generated by NAND logic of the bit line precharge signal line EQLL, and when it is difficult to arrange a delay circuit for delaying the signal line EQLC' from the signal line EQLL in the vicinity thereof, delaying of the control main signal line MDQS for the data bus switches 135, 136 as in this embodiment is easier to apply.

Before time t1, the global data buses MDQ and bMDQ are precharged to high level. When the signal line MDQS turns to high level at time t1, the local data buses LDQ and bLDQ are connected to the global data buses MDQ and bMDQ and turn to high level. Thereafter, when a column selecting line CSL turns to high level, the global data buses MDQ, bMDQ are connected to the bit lines BL, bBL via the local data buses LDQ, bLDQ. The voltages of the global data buses MDQ, bMDQ are outputted as read data to the outside.

The signal line LDQEQ is a signal line logically inverted with respect to the signal line MDQS. During predetermined time t3 to t4 after starting precharge, the signal line LDQEQ is low level, and the gate line PCS of the current limiting elements 104 becomes high level. After time t4, the signal line LDQEQ turns to high level, and the gate line PCS of the current limiting elements 104 becomes the recharge voltage Vbleq.

Sixth Embodiment

Figure 12:
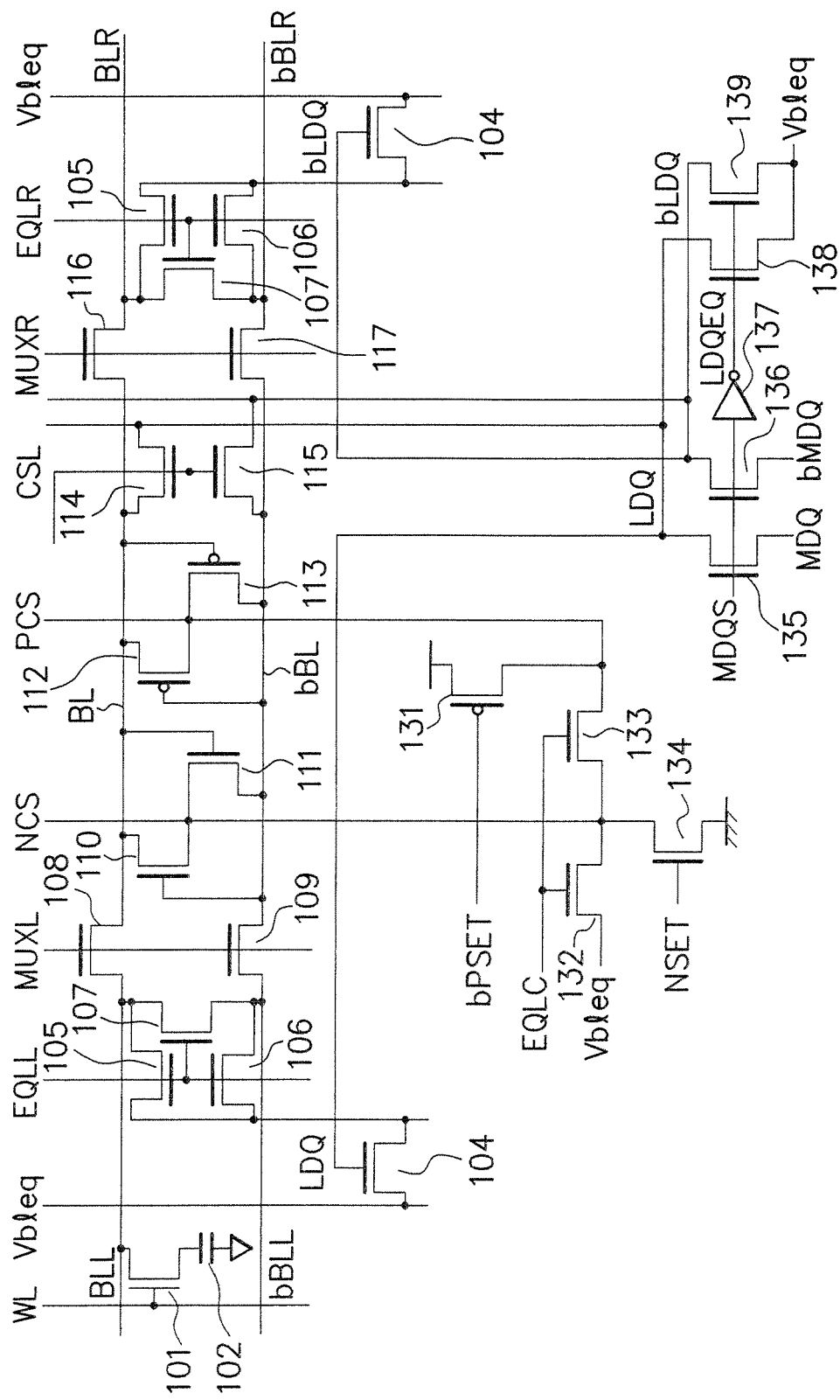
FIG. 12 is a circuit diagram showing a configuration example of a memory cell array according to a sixth embodiment of the present invention.

FIG. 12 is a circuit diagram showing a configuration example of a memory cell array according to a sixth embodiment of the present invention, and FIG. 13 is a signal timing chart for describing an operation thereof. Differences of this embodiment in FIG. 12 from the first embodiment in FIG. 1 will be described. To the gate of a current limiting element 104 of the left memory cell array, a local data bus LDQ is connected, and to the gate of a current limiting element 104 of the right memory cell array, a local data bus bLDQ is connected. The gate voltage of the two current limiting elements 104 are the same as the voltages of the local data buses LDQ and bLDQ respectively.

During a predetermined period t3 to t4 after starting precharge, the local data buses LDQ and bLDQ which are respectively the gate lines of the current limiting elements 104 are high level. After time t4, the local data buses LDQ and bLDQ which are respectively the gate lines of the current limiting elements 104 become a precharge voltage Vbleq. Precharge timing t4 for the local data buses LDQ, bLDQ starts later than precharge timing t3 of the bit lines BLL, bBLL.

In the fourth and fifth embodiments, precharge of the sense amplifier drive lines PCS, NCS is performed later than precharge of the bit lines BLL, bBLL to thereby secure a high level period of the gate voltage of the current limiting element 104 at the time of precharging, and accordingly, completion of precharge of the sense amplifier drive lines PCS, NCS becomes late. Therefore, when a necessary high level period becomes long, there is a possibility that access/cycle time becomes late.

In comparison thereto, it is not necessary in this embodiment to complete the precharge of the local data buses LDQ, bLDQ before a row based active operation accompanying selection of the next word line WL starts, and it just needs to be completed before an operation accompanying selection of the column selecting line CSL starts. Therefore, this embodiment has an advantage that the high level period of the gate voltage of the current limiting element 104 at the time of precharging is easy to be taken longer.

In the fourth to sixth embodiments described above, only existing signals/elements related to the sense amplifier are used to enable dynamic control of the ability of the current limiting element, so that the area of wiring and the area of elements can be reduced, and change in layout from an existing sense amplifier can be minimized also.

As described above, according to the first to fourth embodiments, enlargement of the area of elements is suppressed and at the same time the precharge characteristic as well as the access and cycle time are made faster at the time of precharging a bit line by increasing a supply current to the bit line, and while being in a standby state, a standby current can be reduced by reducing a DC current originated in cross failure by lowering the supply current to the bit line.

Specifically, in the standby state, the gate voltage of the current limiting element is set to a relatively low voltage to limit the current originated in cross failure, but for a generally conceivable shifting factor due to junction leakage in a bit line or the like, a voltage capable of supplying a current having a magnitude which can maintain the voltage of the bit line, for example a voltage such as a bit line precharge voltage, is inputted to the gate.

At the time of starting precharge, the gate voltage of the current limiting element is set to a relatively high voltage to make the precharge characteristic faster. More preferably, at the time of performing an external command operation such as reading/writing/refreshing by an auto refresh command, in other words, being in an active state, the gate voltage is made further higher to make the precharge operation faster to thereby shorten the access or cycle time, and while being in a standby state in which only the self refreshing operation is consecutively performed at a predetermined interval, the gate voltage is set to a lower voltage than that while executing an external command, in other words, being in an active state, to reduce a charging/discharging current at the gate of the current limiting element in the standby state.

Further, a signal of the sense amplifier drive signal line PCS, or local data buses LDQ, bLDQ is inputted to the gate of the current limiting element, and the start of precharging them is delayed for a predetermined period from the start of precharging the bit lines to thereby secure the period that the gate voltage of the current limiting element is high level at the time of precharging the bit lines. Consequently, equalization of the bit lines to the precharge voltage becomes faster. In these embodiments, only existing signals/elements related to the sense amplifier are used to enable dynamic control of the ability of the current limiting element, so that the area of wiring and the area of elements can be reduced, and change in layout from an existing sense amplifier can be minimized also.

The current limiting element is capable of making a precharge characteristic faster at the time of precharging by increasing a current supplied to a bit line, and capable of reducing a standby current while being in a standby state by reducing a DC current originated in cross failure by lowering the supply current. Furthermore, since the magnitude of the supply current to the bit line can be controlled by one current limiting element, the number of elements becomes small, so that the area of elements can be made small.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A memory device, comprising:
   a memory cell to store data;
   a word line to select the memory cell;
   a bit line connectable to the selected memory cell;
   a precharge power supply to supply a precharge voltage to the bit line;
   a precharge circuit to connect or disconnect the precharge power supply to or from the bit line; and
   a current limiting element to control the magnitude of a current flowing between the precharge power supply and the bit line at a precharge time,
   wherein said magnitude of a current flowing includes at least a first magnitude of the current flowing and the second magnitude of a current flowing,
   wherein the first magnitude of a current flowing is larger than the second magnitude of a current flowing.

2. The memory device according to claim 1, wherein the current limiting element sets the first magnitude of a current flowing at the time of starting connection of the bit line to said precharge power supply and sets the second magnitude of a current flowing after predetermined time passes from the time starting the connection.

3. The memory device according to claim 1, wherein the current limiting element sets the first magnitude of a current flowing at any one of a read operation and a write operation, wherein the current limiting element sets the second magnitude of a current flowing at a refresh operation.

4. The memory device according to claim 1,
   wherein the first magnitude of the current flowing includes a third magnitude of the current flowing and a fourth magnitude of the current flowing,
   wherein the third magnitude of the current flowing is larger that the fourth magnitude of the current flowing, and
   wherein the third magnitude of the current flowing is set operation at any one of a read operation and a write operation and the fourth magnitude of the current flowing is set at a refresh.

5. The memory device according to claim 1, wherein the current limiting element includes a transistor, and a gate of which receives a gate voltage corresponding to any one of the first magnitude of the current flowing and the second magnitude of the current flowing.

6. The memory device according to clan 1, wherein the current limiting element controls the magnitude of the current flowing without making a current flowing through the current limiting element substantially zero.

7. A memory device, comprising:
   a memory cell to store data;
   a word line to select the memory cell;
   a bit line connectable to the selected memory cell;
   a precharge power supply to supply a precharge voltage to the bit line;
   a precharge circuit to supply the precharge power supply to the bit line;
   a voltage switching circuit to select any one of a plurality of voltages according to a control signal at a precharge time; and
   a current limiting element to supply the precharge voltage to the precharge circuit based on the selected one of the plurality of voltages at a precharge time,
   wherein the plurality of voltages include a first voltage and a second voltage which is smaller than the first voltage.

8. The memory device according to claim 7, wherein the first voltage is selected at the time of starting supply of the precharge power supply to the bit line and the second voltage is selected after predetermined time passes from the time starting the supply.

9. The memory device according to claim 7, wherein the first voltage is supplied to the current limiting element at any one of a read operation, a write operation and a refresh operation and the second voltage is supplied to the current limiting element after predetermined time passes from the time starting the any one of operations.

10. The memory device according to claim 7, wherein the current limiting element includes a transistor whose gate receives the selected voltage.

11. The memory device according to claim 7,
    wherein the first voltage includes a third voltage and a fourth voltage which is smaller than the third voltage,
    wherein the third voltage is selected at any one of a read operation and a write operation and the fourth voltage is selected at a refresh operation.

12. The memory device according to claim 7, wherein the voltage switching outputs a precharge signal based on the control signal and includes a circuit that generates a selection signal based on the control signal.

13. The memory device according to claim 7, further comprising:
    a sense amplifier to amplify the voltage on the bit line and be used commonly by the adjacent memory sells.

14. The memory device according to claim 7, wherein the current limiting element controls the magnitude of the current flowing without making a current flowing through the current limiting element substantially zero.

15. A memory device, comprising:
    a memory cell to store data;
    a word line to select the memory cell;
    a bit line connectable to the selected memory cell;
    a precharge power supply to supply a precharge voltage to the bit line;
    a precharge circuit to supply the precharge power supply to the bit line; and
    a current limiting element to supply the precharge voltage to the precharge circuit based on a sense amplifier driving signal.

16. The memory device according to claim 15, wherein the current limiting element includes a transistor whose gate receives the sense amplifier driving signal.

17. A memory device, comprising
    a memory cell to store data;
    a word line to select the memory cell;
    a bit line connectable to the selected memory cell;
    a precharge power supply to supply a precharge voltage to the bit line;
    a precharge circuit to connect or disconnect the precharge power supply to or from the bit line; and
    a current limiting element to control the magnitude of a current flowing between the precharge power supply and the bit line, wherein said magnitude of a current flowing includes at least a first magnitude of the current flowing and the second magnitude of a current flowing, wherein the first magnitude of a current flowing is larger than the second magnitude of a current flowing, wherein the current limiting element sets the first magnitude of a current flowing at any one of a read operation and a write operation, and wherein the current limiting element sets the second magnitude of a current flowing at a refresh operation.

18. A memory device, comprising:

a memory cell to store data, a word line to select the memory cell;

a bit line connectable to the selected memory cell;

a precharge power supply to supply a precharge voltage to the bit line;

a precharge circuit to supply the precharge power supply to the bit line;

a voltage switching circuit to select any one of a plurality of voltages according to a control signal; and a current limiting element to supply the precharge voltage to the precharge circuit based on the selected one of the plurality of voltages, wherein the plurality of voltages include a first voltage and a second voltage which is smaller than the first voltage, wherein the first voltage includes a third voltage and a fourth voltage which is smaller than the third voltage, and wherein the third voltage is selected at any one of a read operation and a write operation and the fourth voltage is selected at a refresh operation.

\* \* \* \* \*